(12) United States Patent
Davis et al.

(10) Patent No.: US 8,471,452 B2
(45) Date of Patent: Jun. 25, 2013

(54) APPARATUS

(75) Inventors: Mervyn Howard Davis, Sussex (GB); Andrew James Timothy Holmes, Berkshire (GB)

(73) Assignee: Nordiko Technical Services Limited, Hampshire (GB)

( * ) Notice: Subject to any disclaimer, the term of this patent is extended or adjusted under 35 U.S.C. 154(b) by 643 days.

(21) Appl. No.: 12/305,848

(22) PCT Filed: Jun. 29, 2007

(86) PCT No.: PCT/EP2007/056611
§ 371 (c)(1), (2), (4) Date: Apr. 22, 2010

(87) PCT Pub. No.: WO2008/000836
PCT Pub. Date: Jan. 3, 2008

(65) Prior Publication Data
US 2010/0219740 A1    Sep. 2, 2010

(30) Foreign Application Priority Data

Jun. 30, 2006   (GB) .................................. 0612915.9
Nov. 15, 2007   (GB) .................................. 0622788.8

(51) Int. Cl.
*H01J 27/02* (2006.01)
(52) U.S. Cl.
USPC ..................................... 313/361.1; 313/359.1
(58) Field of Classification Search
USPC ........... 313/359.1, 360.1, 361.1, 362.1, 363.1
See application file for complete search history.

(56) References Cited

U.S. PATENT DOCUMENTS

| 4,149,055 A | 4/1979 | Seliger et al. |
| 4,933,551 A | 6/1990 | Bernius et al. |

(Continued)

FOREIGN PATENT DOCUMENTS

| DE | 10112817 A1 | 10/2001 |
| EP | 1538655 A2  | 6/2005  |

(Continued)

OTHER PUBLICATIONS

Biri et al., The new ECR ion source of the ATOMKI: A tool to generate highly charged heavy ion plasma and beam, Nuclear Instruments and Methods in Physics Research B 124, pp. 427-430, (1997).

(Continued)

*Primary Examiner* — Nimeshkumar Patel
*Assistant Examiner* — Christopher Raabe
(74) *Attorney, Agent, or Firm* — Armstrong Teasdale LLP

(57) ABSTRACT

An apparatus (200) for accelerating an ion beam comprising: a) a first electrode (202) having a proximal side and a distal side and having at least one aperture (201) therethrough, the wall of the aperture being shaped such that the radius of the aperture on the distal side of the first electrode is greater than that on the proximal side of the electrode; b) a second electrode (204) located such that it is adjacent to but spaced from the distal side of the first electrode and having at least one aperture therethrough; and c) a third electrode (206) located such that it is adjacent to and spaced from the second electrode and having at least one aperture therethrough, said at least one apertures in each electrode being aligned with corresponding apertures in the other electrodes; wherein the electrodes are arranged such that there is a potential difference between the first and second electrodes and a potential difference between the second and third electrodes.

11 Claims, 12 Drawing Sheets

Unshaped planar G1 electrode shown dashed. G2 and G3 electrodes are also planar
The Pierce profile on the G1 electrode shown as a solid line. All apertures have circular (rotational) symmetry
The electrostatic lens are formed from the changes in the axial electric field

U.S. PATENT DOCUMENTS

| | | | |
|---|---|---|---|
| 4,963,735 A * | 10/1990 | Okamoto et al. | 250/288 |
| 5,365,070 A | 11/1994 | Anderson et al. | |
| 5,608,773 A | 3/1997 | Korenaga et al. | |
| 6,005,910 A | 12/1999 | Chiba et al. | |
| 6,501,078 B1 | 12/2002 | Ryding et al. | |
| 6,936,981 B2 | 8/2005 | Gesley | |
| 7,145,157 B2 | 12/2006 | Simmons et al. | |
| 2002/0089288 A1 | 7/2002 | Keller | |
| 2003/0230986 A1 | 12/2003 | Horsky et al. | |
| 2005/0056794 A1 | 3/2005 | Simmons et al. | |

FOREIGN PATENT DOCUMENTS

| | | |
|---|---|---|
| GB | 2336029 A | 10/1999 |
| JP | 59207553 A | 11/1984 |
| JP | 06068806 A | 3/1994 |
| JP | 10241589 | 9/1998 |
| JP | 10241589 A | 9/1998 |
| JP | 2004163323 A | 6/2004 |
| WO | 2005038856 A2 | 4/2005 |
| WO | 2007146394 A2 | 12/2007 |

OTHER PUBLICATIONS

International Search Report and Written Opinion regarding PCT/EP2007/056611, dated Jan. 14, 2008.

International Search Report and Written Opinion regarding PCT/GB2008/050098, dated May 27, 2008.

Hamabe et al., "Compensation of beam deflection due to the magnetic field using beam steering by aperture displacement technique in the multibeamlet negative ion source", Review of Scientific Instruments, American Institute of Physics, US, vol. 72, No. 8, pp. 3237-3244, Aug. 2001.

Ito et al., "Low energy beam extraction in terms of magnetic field, electric field and ion optics", Ion Implantation Technology. Proceedings of the 11th International Conference on Austin, Texas, pp. 383-386, Jun. 16, 1996.

* cited by examiner

Unshaped planar G1 electrode shown dashed. G2 and G3 electrodes are also planar
The Pierce profile on the G1 electrode shown as a solid line. All apertures have circular (rotational) symmetry
The electrostatic lens are formed from the changes in the axial electric field

APPARATUS

The present invention relates to apparatus for ion beam acceleration. More specifically, it relates to apparatus for low beam voltage ion acceleration for use in ion beam techniques such as sputtering. In addition, the present invention relates to an apparatus for generating a beam of charged particles.

Ion beams have been used for many years in the production of components in the micro-electronics industry and magnetic thin film devices in the storage media industry. Typically, an ion beam, such as an argon ion beam, is required to have a large area, a high current and an energy of between 100 eV and 2 keV.

The beam can be used in a number of ways to modify the surface of a substrate, for example by sputter deposition, sputter etching, milling, or surface smoothing.

In a typical ion beam source (or ion gun) a plasma is produced by admitting a gas or vapour to a discharge chamber wherein the ions are formed by electron impact ionisation and move within the chamber by random thermal motion. This may be achieved by a dc means using a heated cathode or by high frequency means using an rf antenna.

Modern ion sources are more commonly excited using high frequency electrical discharges other than by an arc. Radio frequencies ranging from about 500 kHz to about 60 MHz are employed although those in the range of from about 13.56 MHz to about 60 MHz may be more commonly employed. There are also devices which use microwave excitation.

To generate an ion beam that is suitable for impaction on a target or a substrate it is necessary to accelerate the ions to a monochromatic energy and defined axial direction. This is generally achieved by the use of a set of accelerating electrodes which may be known as grids.

The plasma will exhibit a positive plasma potential which is higher than the potential of any surface with which it comes into contact. Various arrangements of grids can be used, the potentials of which are individually controlled. In a multi-grid system the first grid encountered by the ions is, usually positively biased whilst the second grid is negatively biased. Additionally, further electrodes may be used to collimate the beam. For ion sputtering a target is placed in the target chamber where it can be struck by the beam of ions, usually at an oblique angle, and the substrate on to which material is to be sputtered is placed in a position where sputtered material can impinge on it. When sputter etching, milling or surface smoothing is to be practised the substrate is placed in the path of the ion beam.

Hence, in a typical ion gun an ion arriving at a multi-aperture extraction grid assembly first meets a positively biased grid. Associated with the grid is a plasma sheath. The potential difference between the plasma and the grid is dropped across this sheath. This accelerating potential will attract ions in the sheath region to the first grid. Any ion moving through an aperture in this first grid, and entering the space between the first, positively biased grid, and the second, negatively biased, grid is strongly accelerated in an intense electrical field. As the ion passes through the aperture in the second grid and is in flight to the earthed, conductive, target it is moving through a decelerating field. The ion then arrives at an earthed target with an energy equal to the potential of the first, positive, grid plus the sheath potential.

Hence, a conventional ion gun comprises a source of charged particles which are accelerated through an externally applied electric field created between a pair of grids. Conventionally, for low energy ion beam production, three grids are used, (although more can be used) the first being held at a positive potential, the second being held at a negative potential adjusted to give the best divergence, and the third, if present, at earth potential, i.e. the potential of the chamber in which the beam is produced.

Beams of this nature are well described in the open literature going back over 70 years.

In the semiconductor, thin film and materials industries ion implantation is a well known technique that is used to embed ion into the crystal lattice of materials to modify their electrical properties. Generally beam voltages in excess of 25kV are used for ion implantation although they can be as high as 500 kV. Many fabricated micro- and nano-devices rely on the detailed nature of thin film interfaces to enhance efficient operation. Therefore the ability to generate atomically smooth surfaces plays an important role in device and thin film fabrication techniques. For example the quality of layer interface is important in the fabrication of thin film magnetic sensors and Extreme Ultra-Violet (EUV) and X-Ray mirror masks.

When using ion beams for thin film processing, other than ion implantation, the beam energy generally has an upper limit of 2 kV but for specific ion beam sputtering processes this value can be as low as 500 V and the efficiency of the process is dependant on the beam energy, where increased energy results in reduced efficiency and increased heat dissipation. There are some applications where it may be desirable to propagate a beam at lower values such as 100V or even as low as 50V. The extraction and propagation of high energy ion beams is known to be easier than low energy beams. This results from the fact that the beam current is proportional to 3/2 times the power of the beam energy described by the Child-Langmuir equation and that the beams exhibit significant divergence, with beam divergence decreasing with increasing beam energy. High energy charged beams have a high velocity as they pass through the accelerator, and thus the effect of space-charge is diminished compared with relatively slower moving ions at low voltage. Space-charge effects contribute to difficulty in generating high density low energy ion beams since they tend to become broad beams made by the coalescence of multiple beamlets, from multiple apertures and the only way to get large current densities (typically providing an integrated output greater than 1 A) is to use a close packed array of small apertures.

For production of thin film magnetic devices such as sensors the process constraints are diffraction limited such that it is difficult to achieve the necessary ion beam size. As the thin film magnetic devices become smaller the constraints on the process become more demanding and it is difficult to achieve good quality low energy ion beams with the required significant current density to process thin films. The constraints on the process include rate of material removal from substrates the non-uniform in thickness of the etched film and the divergence angle of the ion beam. Moreover these constraints must be achieved within a beam energy range of 100 to 700 V. In fact for very sensitive nano devices due to fears of material mixing effects at interfaces beam energies below 100 V such as at about 50 V are sometimes requested. In some cases these constraints are further increased by the need to produce large ion beam diameters to process 200 m and 300 m substrates.

In the fabrication of small devices such as magnetic sensors used in hard disc drives the shape of the device must be symmetric and the same from every part of the substrate on which they are formed. When etching or milling with an ion beam, the divergence of the beam can have a profound effect on this characteristic.

Where the beam axis of a circular beam is aimed at the centre of a circular substrate the effect of the centre is symmetric. For a site not at the centre the effect of divergence is to introduce an asymmetry in illumination. Unless the beam is much larger than the substrate, as the edge of the substrate is approached the illumination is stronger from the centre than from the edge. This results in two undesirable effects. First, the overall non-uniformity within the substrate will display a bell shaped profile. Secondly, the shape symmetry of the patterned feature will deteriorate towards the edge. The inner edge will display a steeper profile than the outer edge.

Both the above deficiencies can be overcome by reducing the beam divergence properties. Two advantages are gained. First, the overall non-uniformity within the substrate will display a desirable top hat shaped profile. Second, the shape symmetry of the patterned feature will remain constant in character on inward and outward facing features across the whole substrate.

The beam divergence at very low energies depends on two processes, the effects of the beam emittance and the effects of the residual un-neutralised beam space charge. The minimum divergence arising from the emittance is the square root of the effective ion temperature divided by the beam energy, both being expressed in electron-volts. The ion temperature is the sum of the true ion temperature in the plasma, typically 0.3 electron-volts (eV), plus the effective temperature created by the disorder induced by spherical aberrations, which in turn are caused by the use of simple unshaped aperture holes. The latter process is normally of far greater effect than the former. The detailed shape of the ion accelerator electrodes is critical in reducing the aberrations as discussed in more detail below.

Since device production requirements specify within substrate non-uniformity and low beam divergence the approach of using an oversized beam is not sufficient to fulfil the requirements of improved beam quality while maintaining sufficient output power. There is therefore a need to produce significantly smaller ion beam sources to achieve the processing requirements of modem semiconductor and thin film devices.

The applications described above require the use of low energy ion beams, i.e. below 500 volts and therefore place a heavy demand on the design of the ion accelerators which are able to operate at the desired energies. The accelerator must first be able to produce the required ion beam current in a reliable manner and secondly the emerging ion beam must also be collimated. Known accelerators consist of two or more thin metal plates, each having an array of circular apertures, such that the apertures in each plate align with the corresponding apertures on other plates or electrodes in the accelerator. These apertures are normally simple holes with sides parallel to the axes of the holes. The inter-aperture separation is typically less than 1 mm.

FIG. 1 shows an idealised drawing of a typical accelerator 10 where the acceleration electrodes shown form a section of a sphere. The ions are extracted from a plasma generator 100 adjacent to the first plate or beam forming electrode 102 of the accelerator (hereinafter the beam forming electrode or G1). This plasma generator 100 produces a plasma consisting of equal number densities of positively charged ions and negatively charged electrons.

The ions are pulled out of the plasma 100 by an ion accelerating electric field. The electrons, which will have a negative charge are repelled by the same field. This field is created by the difference in potential between the beam forming electrode 102 (G1) and the second electrode 104 in the accelerator (hereinafter the extraction electrode or G2). Thus G2 has to be more negative in potential than G1 for positively charged ions to be extracted from the plasma generator.

Once the ions reach the extraction electrode 104 (G2), they have a considerable energy which is equal to the potential difference between G1 and G2 plus a small thermal energy given to them by the plasma sheath. However, there is an additional requirement for the accelerator 10 which is to prevent electrons from the plasma formed by the beam itself downstream of the accelerator, from being extracted backwards through the accelerator 10. If this occurs, considerable damage to the apparatus can occur. This risk can be minimised, by placing an ionic retarding field after the extraction electrode. This is accomplished by adding a third electrode (not shown in FIG. 1) at a higher potential than the extraction electrode but not as high as the beam forming electrode. This latter electrode, G3, is negative, to an order of magnitude of up to 30 Volts, with respect to the beam plasma, which exists between G3 and the target (not shown). As the beam plasma is usually very close to, but positive to, ground the G3 potential is usually ground itself, but it could vary from ground.

Thus the final beam energy is set by the difference in potential between G1 and the beam plasma downstream of the accelerator. Normally the beam plasma is at ground potential, so G3 is also at ground potential. For this reason, G3 is often referred to as the ground electrode. Thus G1 must be at an elevated positive potential to achieve the necessary accelerating electric field.

Beam focusing is primarily controlled by the interface between the plasma generator and the accelerator electrode 102. When the ions are pulled from the plasma and the electrons are repelled, a sheath or meniscus is formed, the position of which is defined by a fall in the electron density by a factor of exponential (−0.5) or 60.6% of its value in the main body of the plasma. The ions cross the meniscus orthogonally with a value equal to half the electron temperature in the plasma and are then accelerated to an energy that is set by the accelerator potentials. Beyond the meniscus, the electron number density declines rapidly to zero and the ions follow ballistic trajectories that are governed by the electrostatic field created by the electrodes and the apertures within these electrodes.

In the triode accelerator arrangement described above, there are two electrostatic lenses formed, one at G2 and one at G3. The former is almost invariably a diverging lens and the latter is always a converging lens. The meniscus and these two lenses form an optical system the function of which is to extract and collimate the ion beam to the desired spot size.

The current of an ion beam depends on many factors. These factors are linked by the Child-Langmuir equation. The full form of this equation for a single circular aperture of radius a is:

$$I = \frac{\pi a^2}{4\pi R_c^2} \times \frac{2.934 \times 10^{-5}}{A^{1/2} \times \alpha^2} \times V^{3/2} \qquad \text{Equation 1}$$

The term A is the ionic mass number which is 40 for a typical plasma gas such as argon. $R_c$ is the curvature radius of the plasma meniscus which adjoins G1, $R_a$ is the curvature radius of the ion trajectories at the extraction electrode, G2, V is the voltage between these two electrodes and a is an infinite series of natural logarithms, the first three terms of which are:

$$\alpha = \ln\left(\frac{R_a}{R_c}\right) - 0.3\left[\ln\left(\frac{R_a}{R_c}\right)\right]^2 + 0.075\left[\ln\left(\frac{R_a}{R_c}\right)\right]^3 - \ldots \qquad \text{Equation 2}$$

Practically Equation 1 is simplified using standard mathematical techniques to yield:

$$I = 1.72 \times 10^{-7} \frac{a^2 V^{3/2}}{A^{1/2} d^2} \times \left(1 - 0.8 \frac{d}{R_c}\right)^2 \qquad \text{Equation 3}$$

Equation 3 illustrates the difficulties of operation at very low extraction energies. If the ion mass is defined as well as the beam energy, V, then, if a large ion current is required, the extraction gap, d must be reduced. However experiments have shown that this is only feasible if the aperture radius, a, is always kept to no more than half the gap, d. At the same time beam collimation requirements set the concave meniscus curvature, to four times the gap distance, so that the last term of Equation 3 becomes 0.64. Thus conventional low voltage accelerators have very short gaps and even smaller aperture radii in order to maximise the beam current.

As a result the extraction electrodes have to be very thin in order to avoid the short gap becoming even shorter. In this connection, it should be noted that the gap always includes the electrode thicknesses as this forms part of the effective electrostatic gap. The use of very thin extraction electrodes means that the grids are mechanically relatively weak. This is a problem since it makes it difficult to build reliable, large span, low voltage accelerators.

One proposal for increasing the beam current and retaining good quality optics is to use a very large potential between G1 and G2, followed by an almost equal, but opposed potential between G2 and G3. The final beam energy is the difference between these two large potentials, but the beam extraction from the plasma is governed by the large G1-G2 potential (V in the Equation 3). This mode of operation is known as "accel-decel".

Whilst accel-decel systems have been proposed, they have not been successfully commercialised as the large potentials generally induce aberrations. It is acknowledged that all accelerators include some "decel" characteristics and could therefore be argued to be "accel-decel". However in these arrangements, the ratio is generally only 0.1 and therefore they are not true "accel-decel" systems in the context of the present invention. This is the ratio of $V_{decel}$ to $V_{beam}$ where $V_{decel}$ is the second gap voltage expressed as a positive number.

Equation 3 is simplified to assume that the beam electrodes are infinitely thin sheets which form part of a complete sphere. However, this is physically unrealistic and therefore the results have inherent problems. It has been suggested in J. R. Pierce, J of Applied Physics vol 11 1940 p548 that the electrodes should be shaped. In particular, a special bevel is proposed for a G1 electrode of finite thickness adjacent to the plasma meniscus so that the remainder of the accelerator sees the same electric fields as would have existed in an accelerator that was a complete sphere.

If the proposal was taken to the end point, the beam would be completely free of all spherical aberration. However, this would require an extremely large separation between adjacent apertures, which is impractical. Thus this proposal has also not been commercialised.

The present invention seeks to overcome the problems associated with the prior art and provide a system for producing an ion beam having low divergence and reduced spherical aberration and which propagates with sufficient power density (also referred to herein as current density).

Thus according to the present invention there is provided apparatus for accelerating an ion beam comprising:

a first electrode having a proximal side and a distal side and having at least one aperture therethrough, the wall of the aperture being shaped such that the radius of the aperture on the distal side of the first electrode is greater than that on the proximal side of the electrode;

a second electrode located such that it is adjacent to but spaced from the distal side of the first electrode and having at least one aperture therethrough; and a third electrode located such that it is adjacent to and spaced from the second electrode and having at least one aperture therethrough, said at least one apertures in each electrode being aligned with corresponding apertures in the other electrodes;

wherein the electrodes are arranged such that there is a potential difference between the first and second electrodes and a potential difference between the second and third electrodes.

It will be understood that the "first", "second" and "third" electrodes and references to the distal and proximal sides thereof relate to the direction of travel of the beam.

Advantageously, as a result of the shaped aperture arrangement in the first electrode, spherical aberrations are substantially eliminated from the accelerated ion beams and the entire extraction aperture is used, when compared to the prior art, such that larger apertures can be used. This provides significantly improved uniform spot homogeneity over a given cross-sectional area.

Whilst the invention of the present invention will generally only have shaped aperture(s) in the first electrode, they may be present in the second and/or the third electrodes.

Preferably the first electrode is a beam forming electrode, the second electrode is an extraction electrode and the third electrode is a ground electrode. Additionally or alternatively, the second electrode is a diverging electrostatic lens and the third electrode is a focusing electrostatic lens. In this preferred arrangement, diverging and focusing electrostatic lenses are provided which result in highly collimated beams.

The shaped aperture of the first electrode, which may be a bevelled shape, together with the differing potential between the electrodes, means that the present invention provides a low divergence, reduced spherical aberration ion beam which propagates with sufficient power density. Additionally this arrangement provides for a more robust ion accelerator which is less prone to the effects of the plasma source heat load. A further benefit is that manufacturing costs are reduced since the apparatus does not require a complicated arrangement of spherical electrodes.

Any suitable shape of aperture may be provided. In one arrangement, the aperture may have a bevelled profile. This bevelled profile may have any suitable shape but in one arrangement, may be flat for at least a portion of the thickness of the electrode and then slope outwardly at an angle of from about 20° to about 60°. An angle of about 45° may be particularly useful. The angle is the angle from a plane perpendicular to the axis of the ion beam.

The or each aperture in the electrodes may be of any suitable shape however, they will generally be circular.

The bore radius of the aperture on the proximal side of the first electrode may be less than the bore radius of the aperture on the distal side of the first electrode, The ratio of the bore radius on the proximal side of the first electrode i.e. at the entrance to the aperture to the bore radius on the distal side of the first electrode, i.e. at the exit to the aperture may be from about 1.2 to about 1.4, more preferably about 1.3. 1.5 may also be suitable.

The ratio of the thickness from the proximal to the distal side of the first electrode to the aperture radius may be from about 0.5 to unity. A typical value is about 0.7.

The potentials of the various electrodes can be selected as appropriate. In one arrangement, the potential difference between the first and second electrodes and the potential difference between the second and third electrodes may be approximately equal and opposite in magnitude.

In a preferred arrangement of the present invention the ratio of the potential difference across the gap between the first electrode and the second electrode to the final beam energy is at least 2:1. More preferably it is 3:1 with 2:5 also being suitable. However, it may be as high as 100:1 with ratios in the region of about 40:1 offering some advantages.

The final beam energy will be defined by the difference in potential between the first and third electrodes and the beam current will be defined by the difference in potential between the first and second electrodes. The beam energy required will vary with the intended use of the beam and thus assuming that the third electrode is at ground potential then the potential of the first electrode will also be fixed. However, the potential of the second electrode may be selected to provide the desired beam collimation.

The accelerator of the present invention may be used in apparatus for the production of low energy charged particle beams and thus according to a second aspect of the present invention there is provided an apparatus for the production of low energy charged particle beams comprising a plasma chamber, means for generating in the plasma chamber a plasma comprising particles of a first polarity and oppositely charged particles of a second polarity; means for restraining particles of the first polarity in the plasma chamber and an accelerator according to the above first aspect wherein the proximal face of the first electrode contacts the plasma.

The invention is described further hereinafter, by way of example only, with reference to the accompanying drawings, in which.

Figure 1:
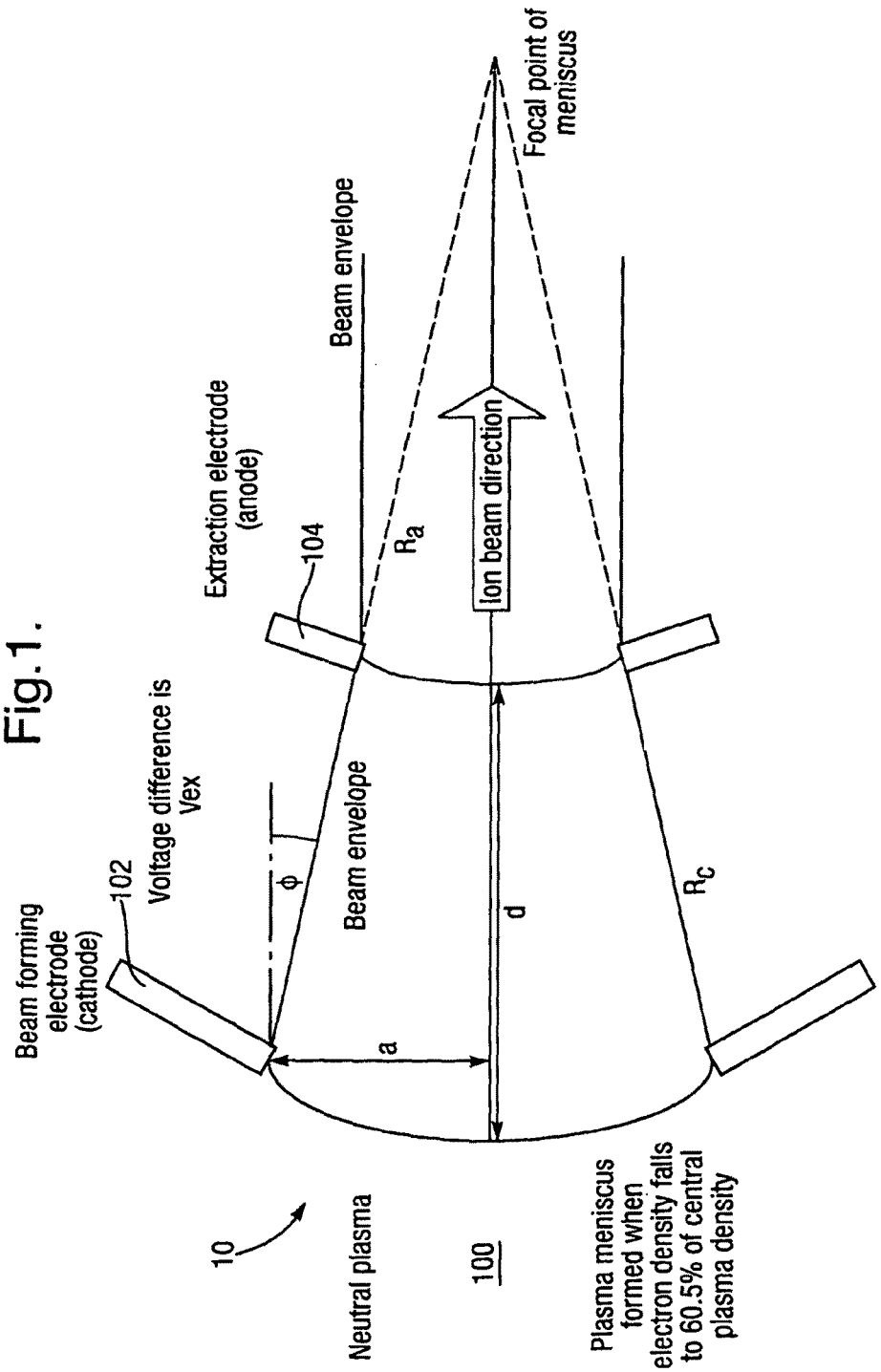
FIG. 1 illustrates a prior art arrangement of a spherical diode acceleration arrangement.
Figure 2:
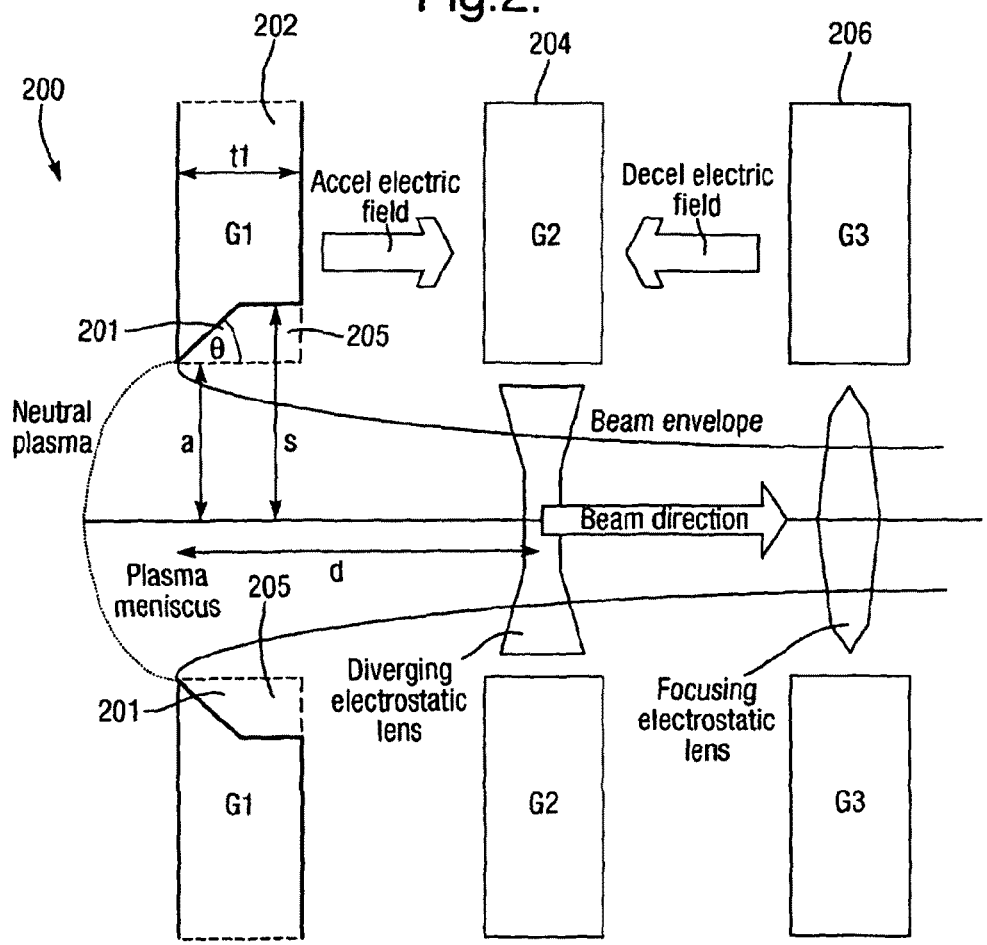
FIG. 2 illustrates a cross section of a bevelled aperture and electrode arrangement according to the present invention.

As illustrated in FIG. 2, the present invention provides an ion accelerator 200 in the form of a triode. The triode arrangement includes a first beam forming electrode 202, a second extraction electrode 204 and a third electrode 206 known as a ground electrode. All the electrodes have apertures therethrough and each aperture is planar and has circular or rotational symmetry about the centre of the apertures. The electrodes are arranged in series such that their apertures are substantially aligned.

The aperture of beam forming electrode 202 comprises a bevelled or cut away portion 203. The bevel 203 is arranged such that it has circular or rotational symmetry about the centre of the beam forming electrode aperture. The bevel 203 is positioned on the opposite side of the beam forming electrode to a plasma generation source. The bevel has four critical dimensions; the aperture entrance radius a, the counterbore or aperture exit radius s, the angle $\theta$ forming the angle of the bevel and the thickness of the electrode material $T_1$. The angle $\theta$ is defined as the angle in the metal, i.e. that from a plane perpendicular to the axis of the ion beam. Suitable and typical values for the critical dimensions are shown in Table 1 below.

TABLE 1

| Bevel Dimensions | | |
|---|---|---|
| Parameter | Suitable Values | Typical Value |
| $\Theta$ | 20° to 60° | 45° |
| s/a | 1.1 to 1.7 | 1.3 |
| $T_1$/a | 0.5 to 1 | 0.7 |

In the table, the geometry of the first grid is expressed as a set of dimensionless numbers. The first of these in the angle $\Theta$, the second is the counterbore radius divided by the aperture radius s/a and the third is the thickness of the electrode material divided by the aperture radius $T_1$/a. It will therefore be understood that the optimum values are not tied to a specific size of aperture.

The dotted line 205 shows where the outer rim of the aperture 201 would lie if the aperture were not bevelled. More particularly, the outer surface of the aperture would extend flush with the across the aperture to a point bounded by the inner radial diameter of the aperture.

As a result of the bevel arrangement described, the accelerator fields form part of an idealised spherical accelerator, thereby almost eliminating spherical aberrations. Secondly, the entire extraction electrode aperture 204 is used to create a useful beam not just the central part of that electrode and as a result larger apertures can be used.

The final beam energy extracted from the accelerator 200 is defined by the difference in potential between the beam forming electrode 202 and the ground electrode 206 and the beam current is defined by the difference in potential between the beam forming electrode 202 and the extraction electrode 204. Assuming that the ground electrode 206 is fixed at a ground potential then the potential of the beam forming electrode 202 is also fixed. It follows therefore that the extraction electrode 204 potential can be fixed to any desired value within the constraints of beam collimation requirements. This type of accelerator is termed an accel-decel accelerator as the beam is first accelerated strongly and then retarded (decelerated) almost as strongly.

In order to assess the correct extraction electrode 204 potential and the severity of the remaining aberrations ion optics code may be used with both space charge, a plasma source simulation and both electron and ion temperatures. The arrangement of the present invention was tested using an Axcel code sold by ING GmbH.

Figure 3:
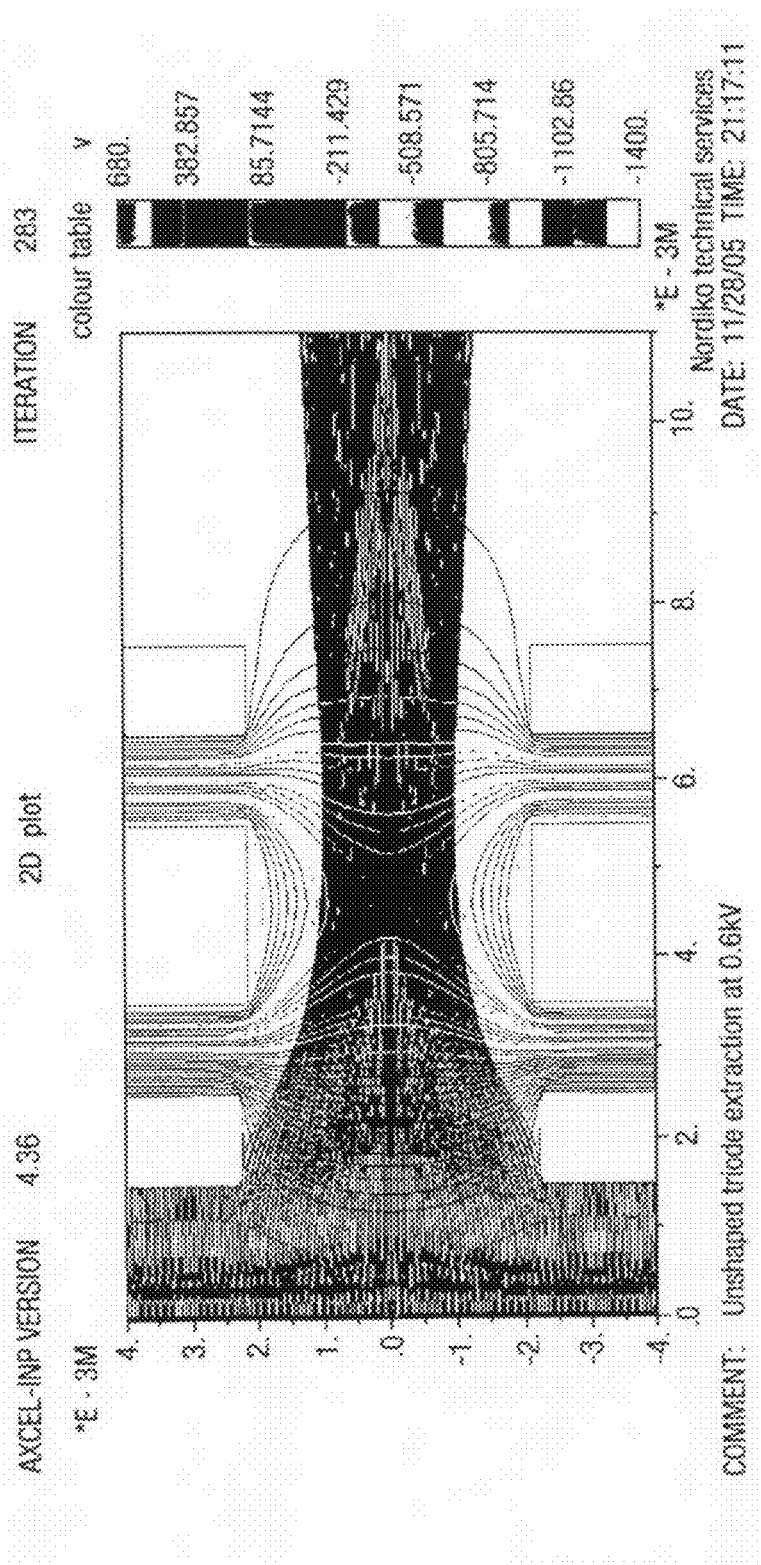
FIG. 3 illustrates an Axcel picture of the arrangement in FIG. 2 with unshaped apertures.

FIG. 3 shows an ion extraction plot for an unshaped accelerator according to the prior art. The accelerator plots show a full model of the ion trajectories, starting within the plasma where the space charge is neutralized by the plasma electrons.

For this reason the potential is increased by from about 30V to about 80V to allow for the plasma potential in the source. The code allows for the beam downstream of the accelerator to be space charge neutralized by an additional plasma.

Figure 4:
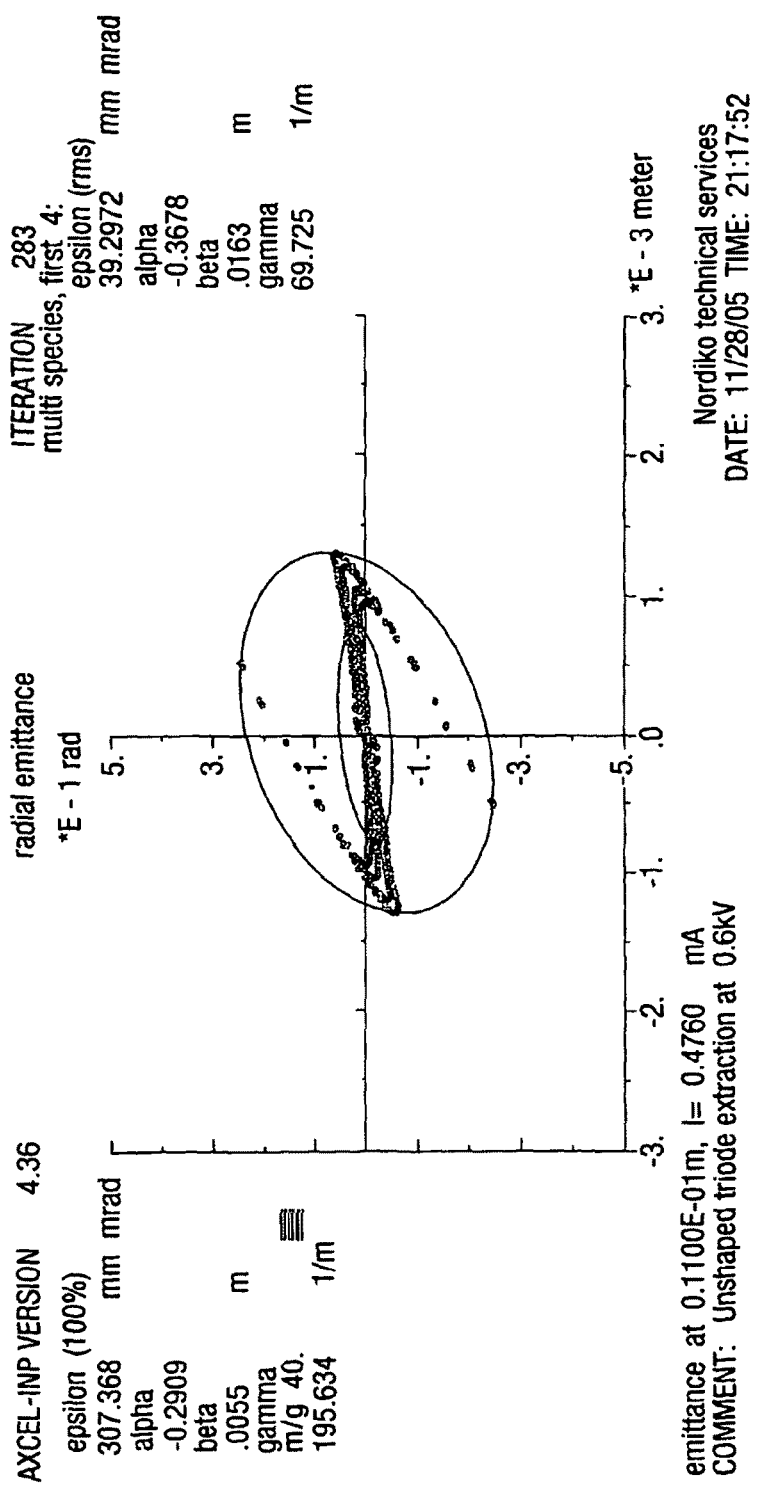
FIG. 4 illustrates an Axcel emittance diagram according to FIG. 3.

The severity of the aberrations created by this type of unshaped accelerator are shown in FIG. 4 as an emittance diagram where each ray in FIG. 3 is represented by a point in the radius (x) and divergence (x') plane. The outer wings of the beam turn up and down forming an 'S' shape. These are the aberrations and constitute ~40% of the beam. This part of the beam is of little use in the applications described above.

Figure 5:
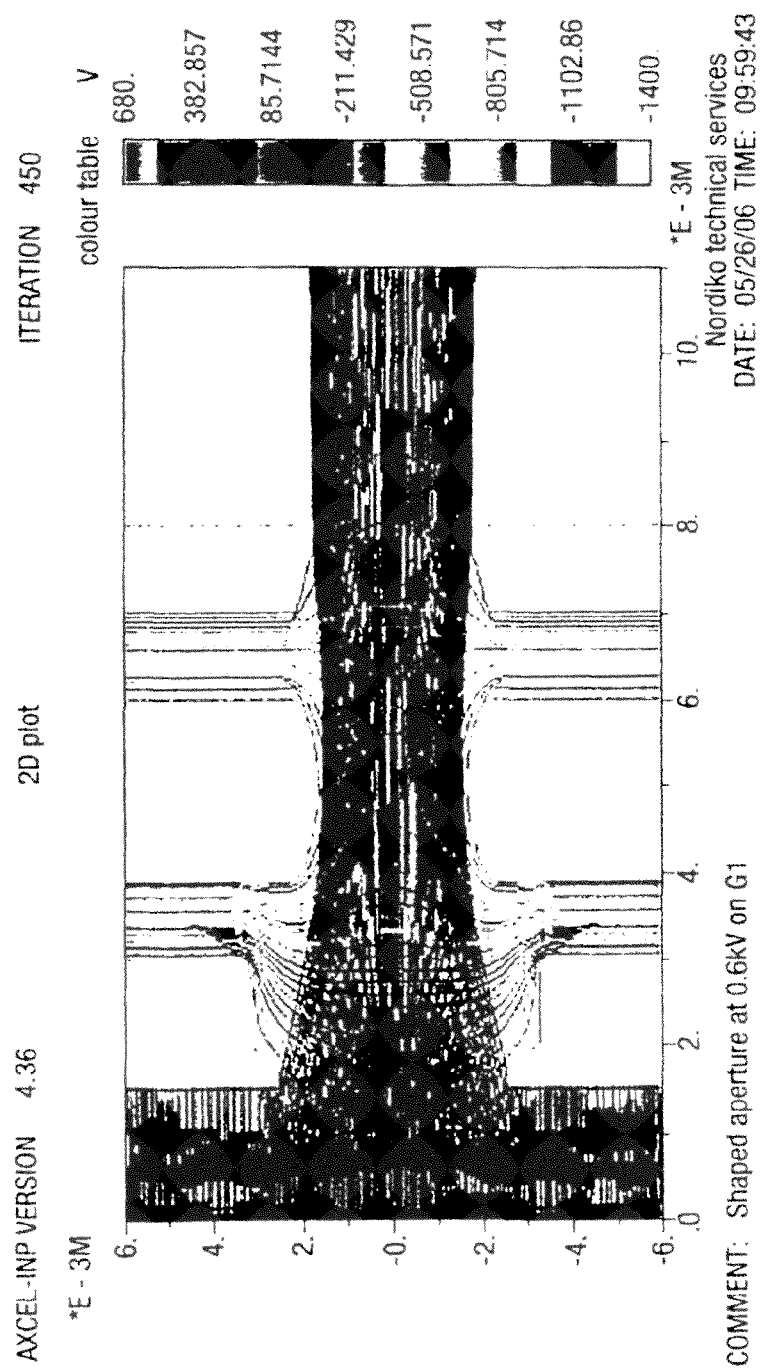
FIG. 5 illustrates an Axcel plot of a 5 mm shaped electrode at 600V.
Figure 6:
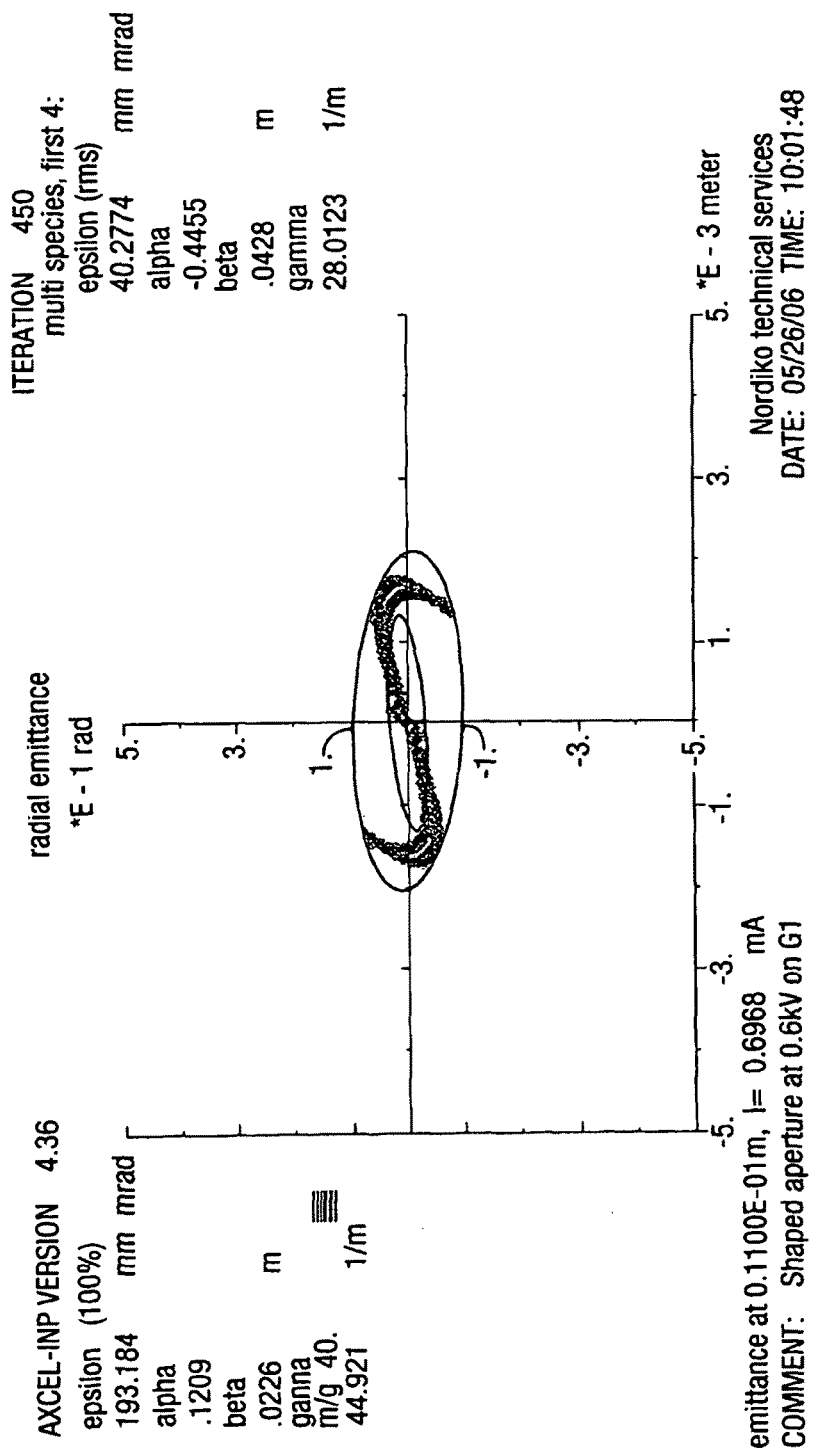
FIG. 6 shows an Axcel emittance diagram of the arrangement in FIG. 5.

By replacing the un-bevelled extraction electrode of the prior art with a bevelled extraction electrode and making some necessary adjustments to the gaps as understood by those skilled in the art to accommodate the electrode results in the improvements illustrated in FIGS. 5 and 6. As can be seen form a comparison of FIGS. 4 and 6, the reduction in aberrations is stark, as they have all but been eliminated. Furthermore the beam current has risen for the same gaps, potentials and aperture diameter from 0.47 mA per aperture to 0.7 mA per aperture. This latter effect arises from the rays at the edge of the hole forming part of the main beam and carrying their share of the beam current.

Figure 7:
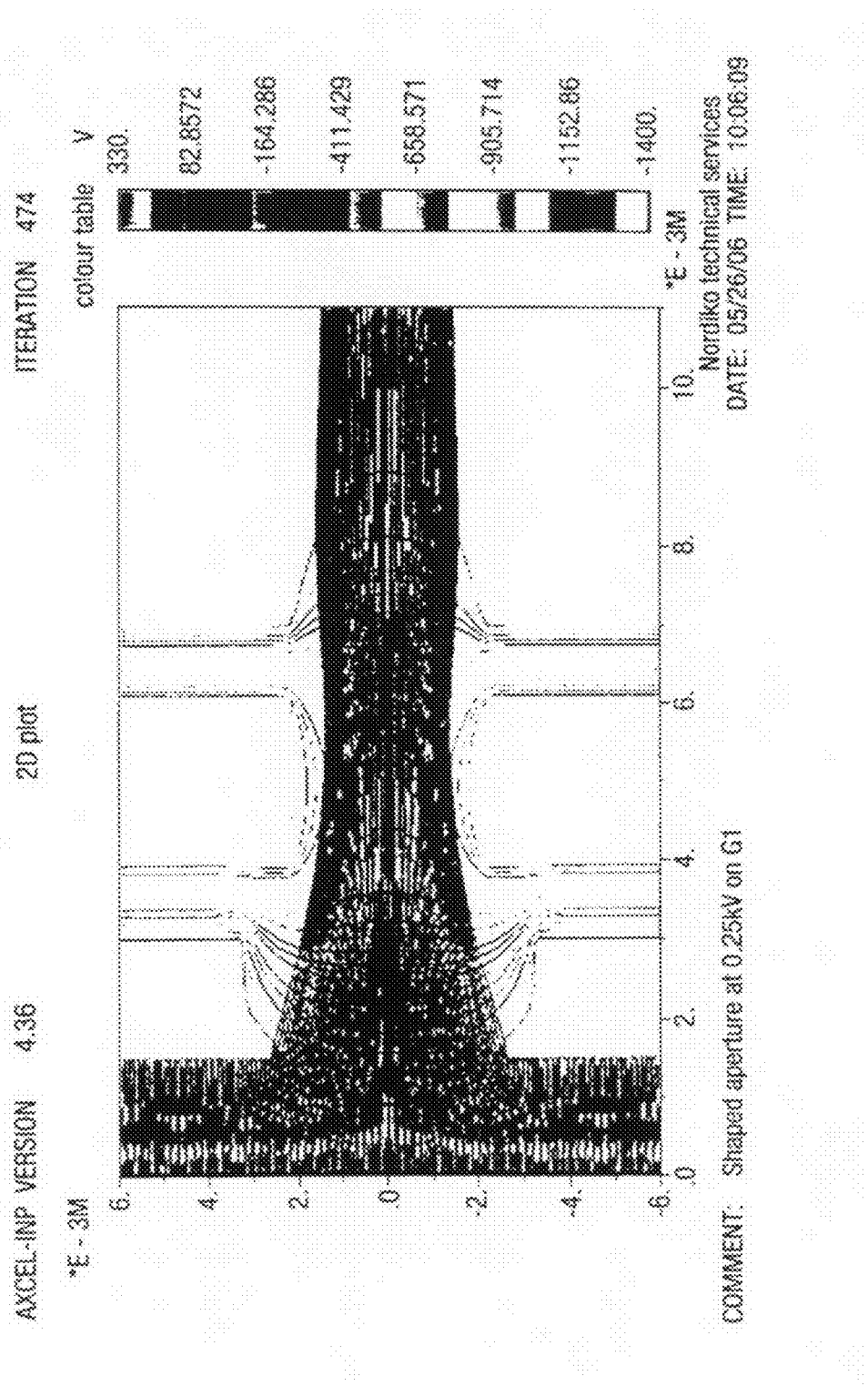
FIG. 7 illustrates an Axcel plot of a 5 mm shaped electrode at 250V.
Figure 8:
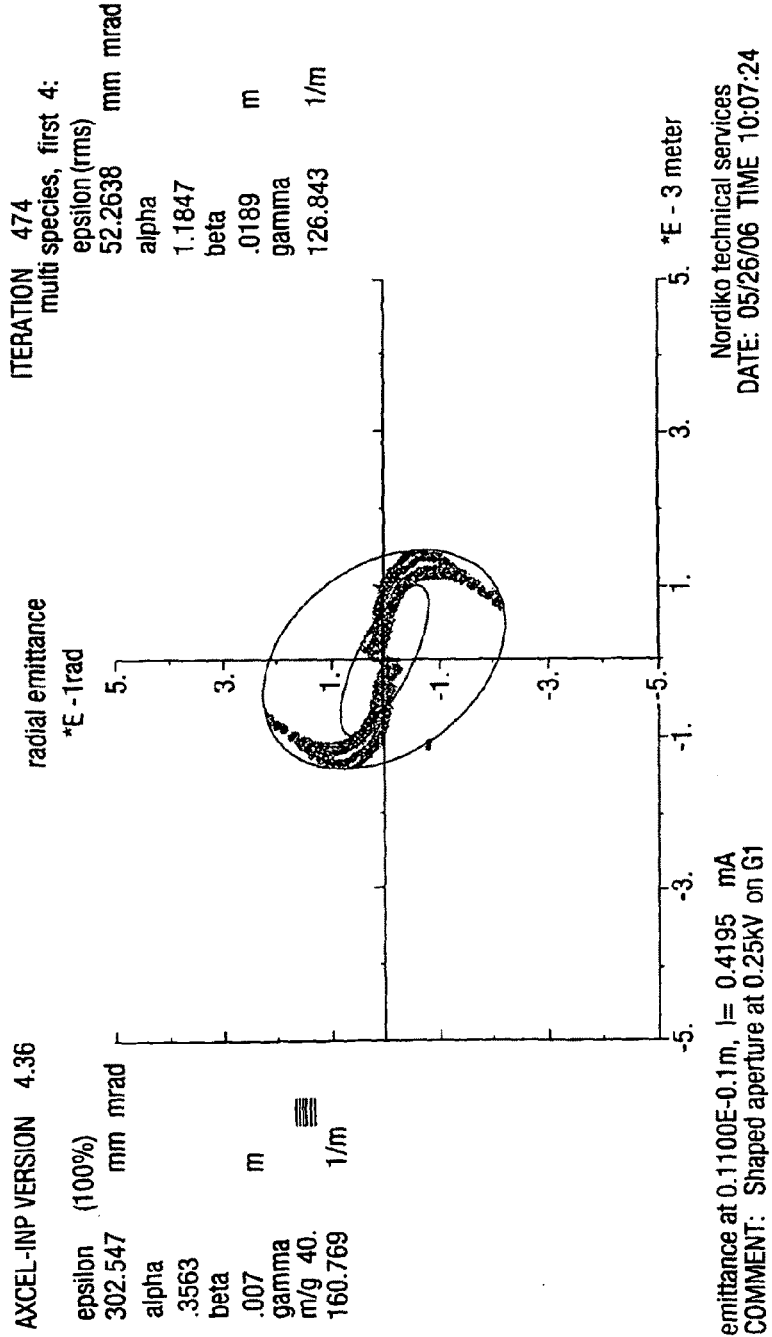
FIG. 8 illustrates an Axcel emittance diagram of the arrangement in FIG. 7.

However ultra low beam operation is still difficult as the current will still fall as the 3/2 power of the beam energy across the inter-electrode gap. This is seen in FIGS. 7 and 8 where the same geometry as FIGS. 5 and 6 is used but with the beam energy now reduced to 250V. The beam current falls to 0.45 mA and the aberrations have increased.

Figure 9:
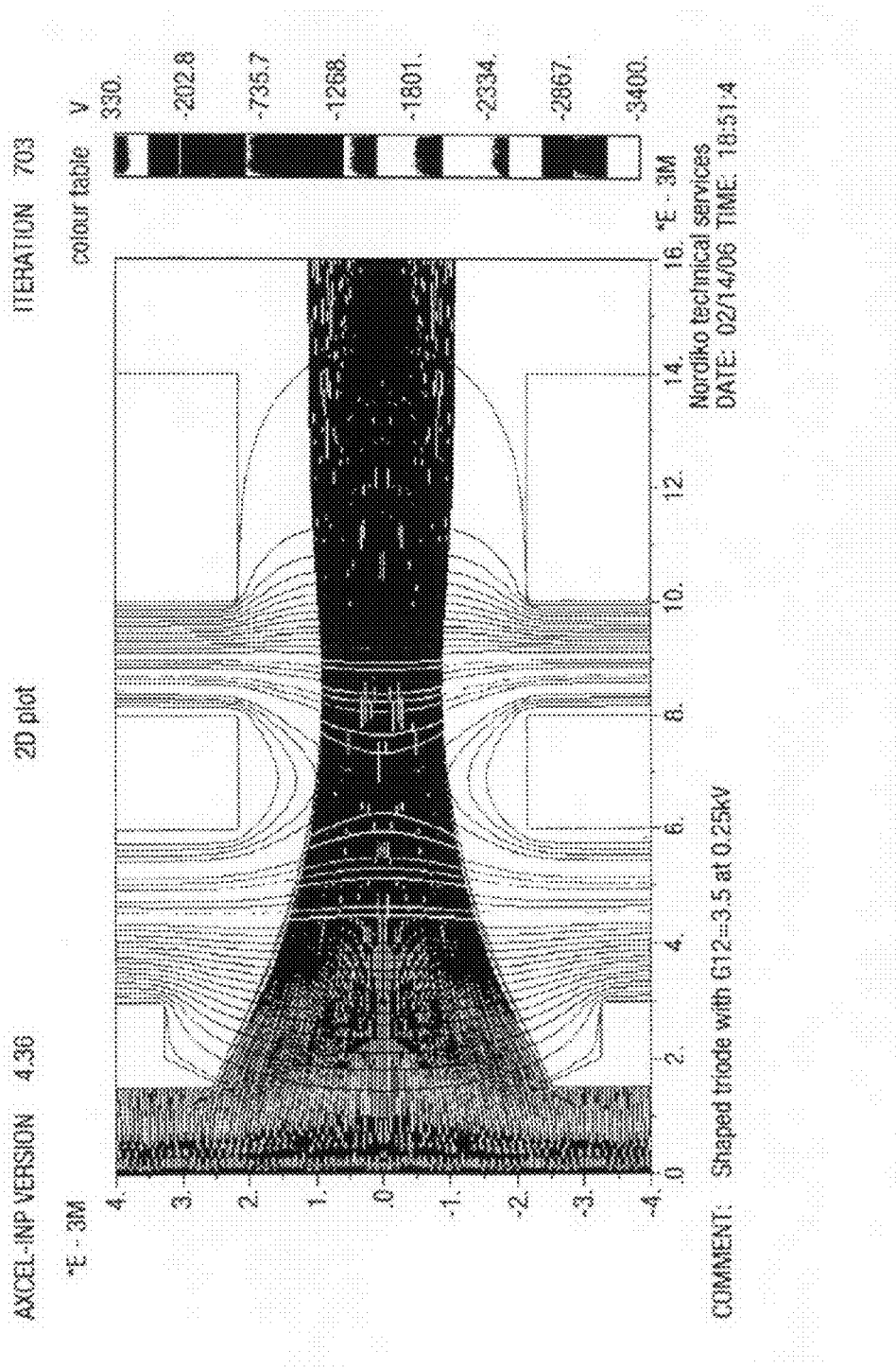
FIG. 9 illustrates an Axcel plot of a 5 mm shaped electrode at 250V with strong accel-decel.
Figure 10:
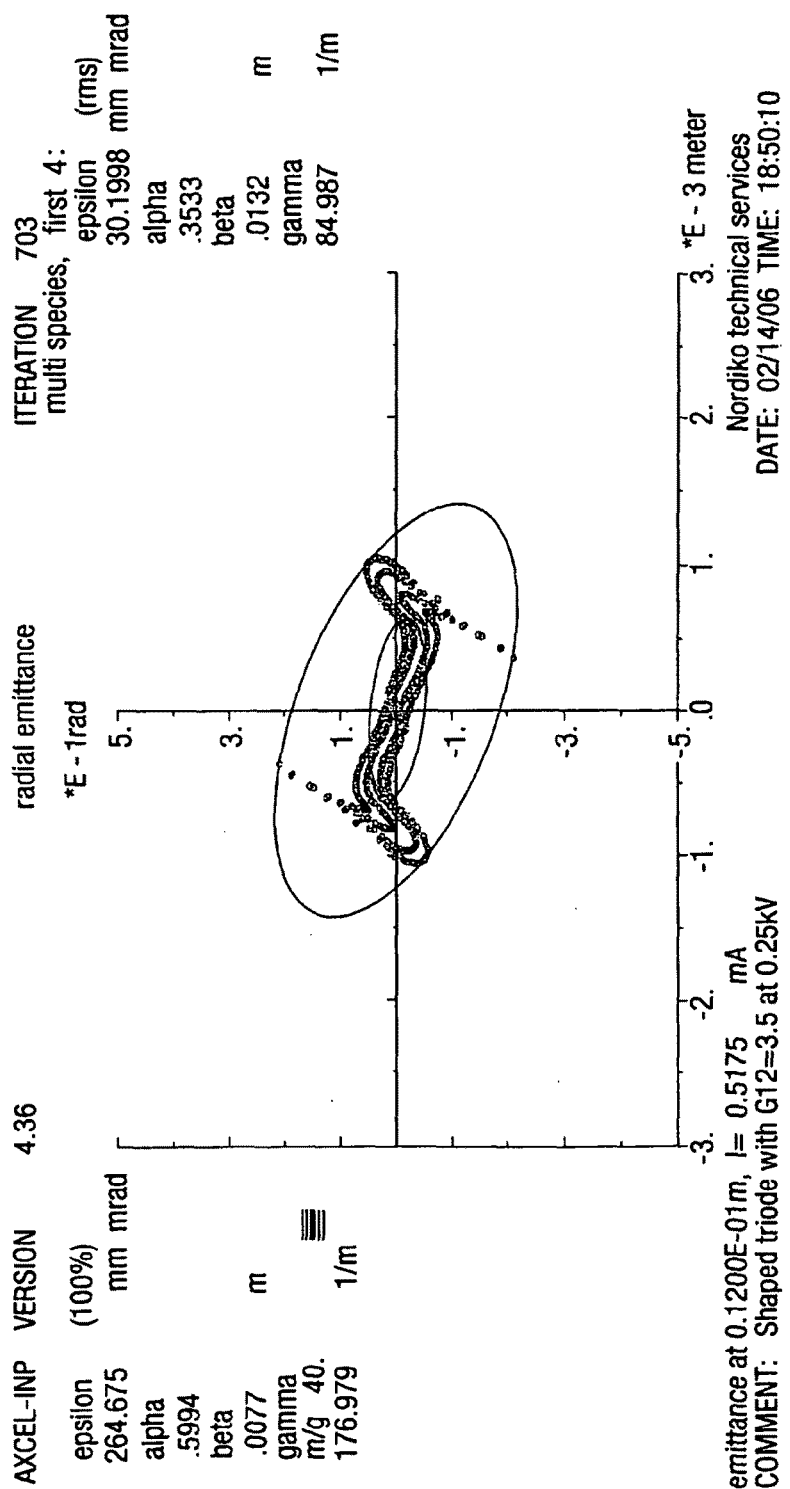
FIG. 10 illustrates an Axcel emittance diagram of the arrangement in FIG. 9.

The accel-decel mode of operation in conjunction with the bevelled electrode arrangement get round this problem of current reduction at very low energy and keep the aberrations at a low level. This is shown in FIGS. 9 and 10 where a 5 mm diameter aperture operating at 250 V is shown. It is difficult to keep the beam entirely free of aberrations at this very low energy but there is the side benefit of a higher beamlet current despite the low energy as seen in FIG. 9.

A further advantage is that the electrodes are much more rigid than the prior art geometry shown in FIG. 4 as they are now much thicker by exploiting the ability of the accelerator to operate at very high extraction electrode potentials. The gaps have also been increased to 3 mm, making the accelerator more resistant to high voltage sparking.

Figure 11:
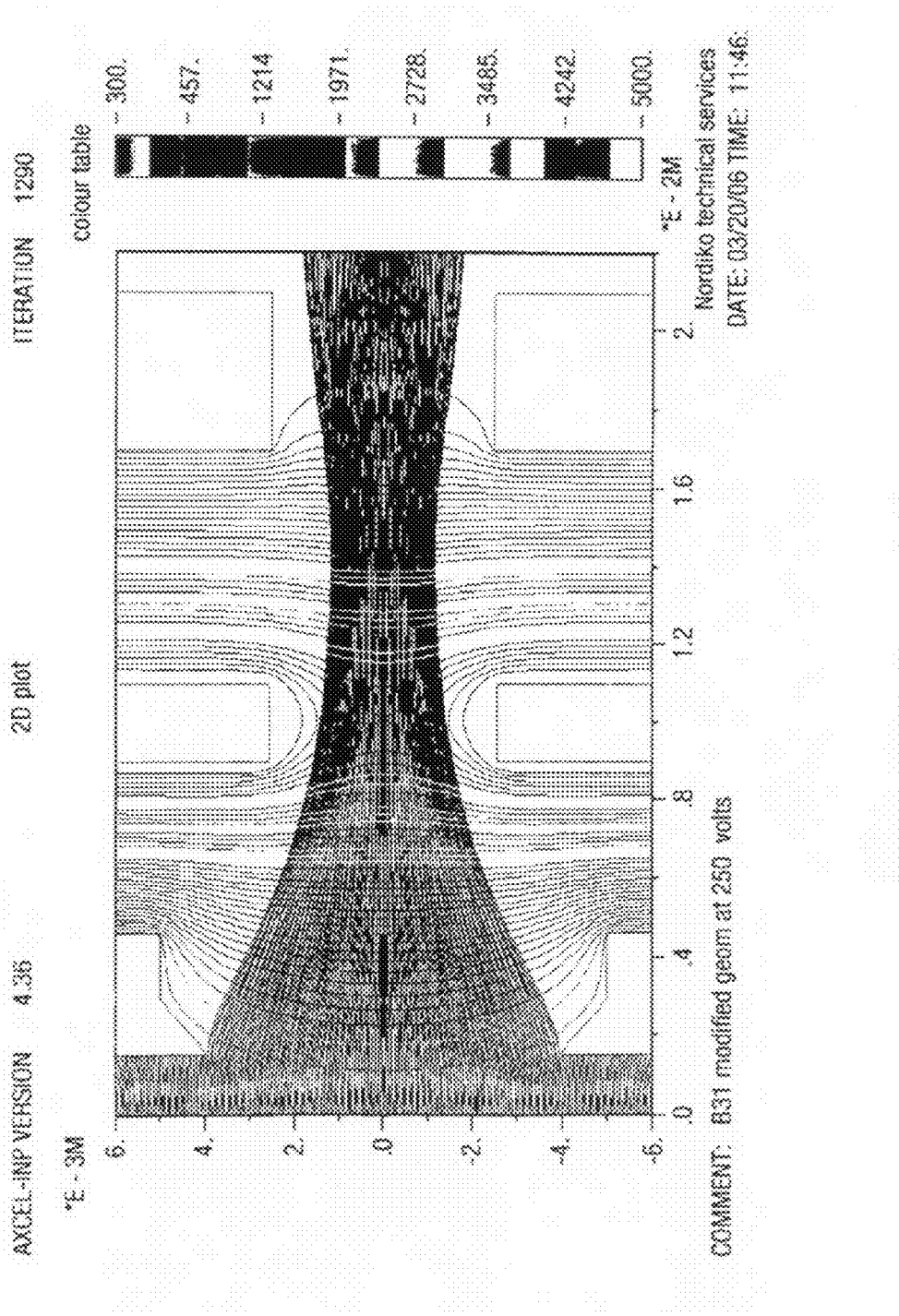
FIG. 11 illustrates an Axcel plot of a 8 mm shaped electrode at 250V with strong accel-decel.
Figure 12:
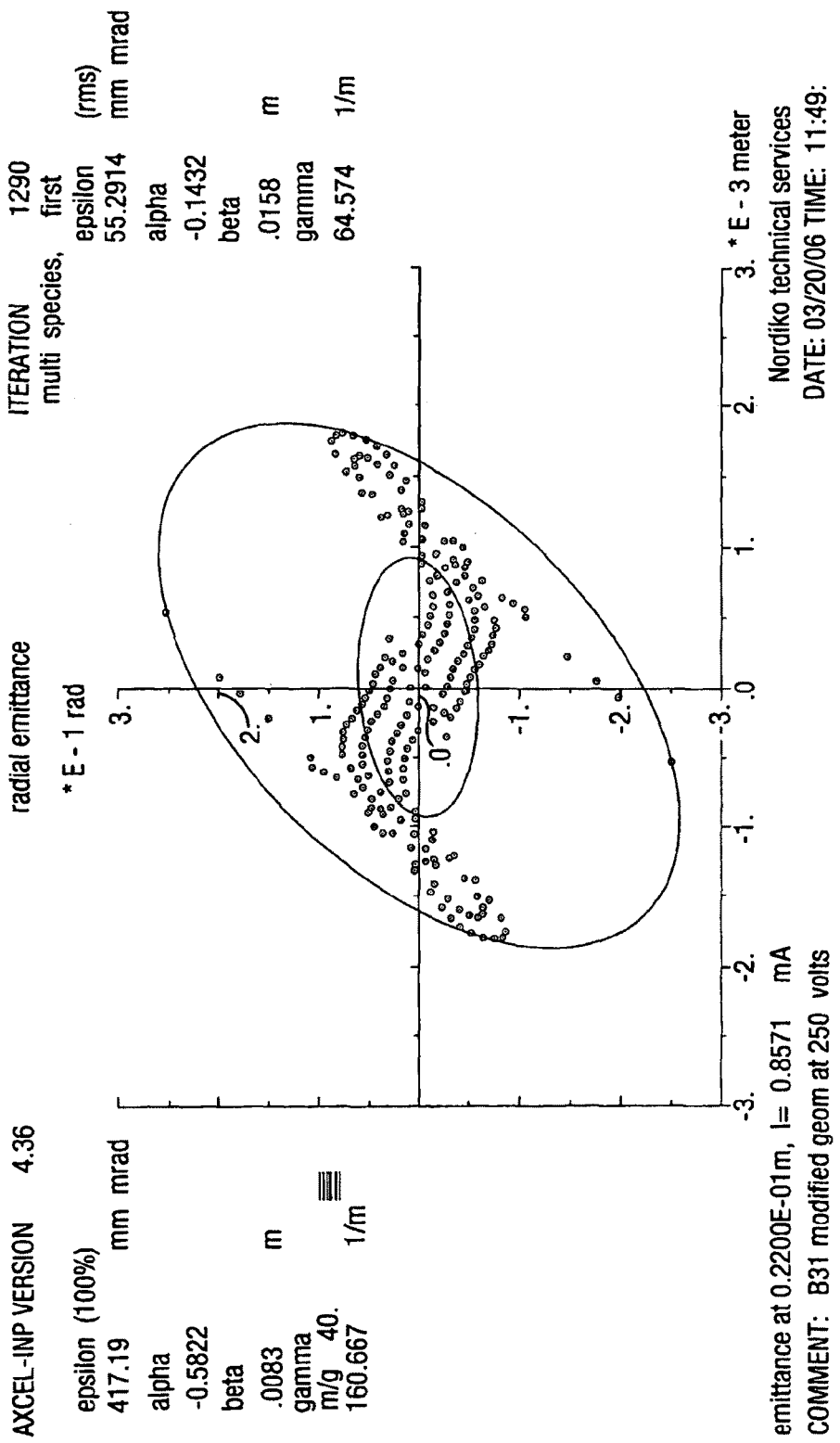
FIG. 12 illustrates an Axcel emittance diagram of the arrangement in FIG. 11.

It is possible to increase the beam forming electrode 202 aperture diameter to 8 mm as seen in FIGS. 11 and 12. This option allows for thicker electrodes and higher operating potentials, hence making it very robust, particularly the beam forming electrode 202, which is the most vulnerable as it is exposed to the plasma source heat load and is hence prone to buckling at large diameters. The smaller number of apertures has an advantage of reducing the manufacturing cost.

In this way, it can be seen that the present invention provides for a low divergence, reduced spherical aberration ion beam which propagates with sufficient power density. Furthermore the present invention provides for a more robust ion accelerator which is less prone to the effects of the plasma source heat load.

The invention claimed is:

1. Apparatus for accelerating a beam of positive ions comprising:
    a first electrode having a proximal side and a distal side and having at least one aperture therethrough, the wall of the aperture being shaped such that the radius of the aperture on the distal side of the first electrode is greater than that on the proximal side of the electrode;
    a second electrode located such that it is adjacent to but spaced from the distal side of the first electrode and having at least one aperture therethrough; and
    a third electrode located such that it is adjacent to and spaced from the second electrode and having at least one aperture therethrough,
    said at least one apertures in each electrode being aligned with corresponding apertures in the other electrodes;
    wherein said first electrode is arranged to operate at a first potential, said second electrode is arranged to operate at a second potential, and said third electrode is arranged to operate at a third potential, and wherein there is a potential difference between the first and second electrodes and a potential difference between the second and third electrodes;
    wherein a ratio of potential difference across a gap between the first electrode and the second electrode to a final beam energy is at least 2:1;
    wherein a thickness of the first electrode material divided by the aperture entrance radius is from 0.5 to 1;
    wherein the aperture side wall of the first electrode is beveled for a portion of the thickness of the first electrode on the proximal side and flat for a remaining portion of the thickness of the first electrode on the distal side of the first electrode, with the bevel sloping at an angle of from 20° to 60°; and
    wherein a ratio of the bore radius on the proximal side of the first electrode to the bore radius on the distal side of the first electrode is 1.1 to 1.7.

2. Apparatus according to claim 1 wherein the first electrode is a beam forming electrode, the second electrode is an extraction electrode and the third electrode is a ground electrode.

3. Apparatus according to claim 1 wherein the second electrode is a diverging electrostatic lens and the third electrode is a focusing electrostatic lens.

4. Apparatus according to claim 1 wherein said angle is 45°.

5. Apparatus according to claim 1 wherein the apertures in the electrodes are the same shape.

6. Apparatus according to claim 5 wherein the apertures are circular.

7. Apparatus according to claim 1 wherein the ratio of the bore radius on the proximal side of the first electrode to the bore radius on the distal side of the first electrode is from about 1.2 to about 1.4.

8. Apparatus according to claim 1, wherein the ratio of the bore radius on the proximal side of the first electrode to the bore radius on the distal side of the first electrode is about 1.3.

9. Apparatus according to claim 1 wherein the ratio of the thickness from the proximal side of the first electrode to the distal side of the first electrode to the aperture radius is about 0.7.

10. Apparatus according to claim 1 wherein the potential difference between the first and second electrodes and the potential difference between the second and third electrodes is approximately equal and opposite in magnitude.

11. An apparatus for the production of low energy charged particle beams comprising a plasma chamber, means for generating in the plasma chamber a plasma comprising particles of a first polarity and oppositely charged particles of a second polarity; means for restraining particles of the first polarity in the plasma chamber and an accelerator according to claim 1 wherein the proximal face of the first electrode contacts the plasma.

* * * * *